US006836755B2

United States Patent
Nardin et al.

(10) Patent No.: US 6,836,755 B2
(45) Date of Patent: Dec. 28, 2004

(54) METHOD AND APPARATUS FOR FULLY AUTOMATED SIGNAL INTEGRITY ANALYSIS FOR DOMINO CIRCUITRY

(75) Inventors: Mark D. Nardin, Portland, OR (US); Hans Greub, Cornelius, OR (US); Sapumal Wijeratne, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,717

(22) Filed: Dec. 30, 1999

(65) Prior Publication Data

US 2003/0078764 A1 Apr. 24, 2003

(51) Int. Cl.[7] .................... G06F 17/50; G06F 9/45; G06G 7/62
(52) U.S. Cl. .................... 703/13; 716/4; 716/5; 716/6
(58) Field of Search .................. 703/13, 14; 716/4, 716/5, 6

(56) References Cited

U.S. PATENT DOCUMENTS

| | | | | |
|---|---|---|---|---|
| 5,047,970 A | * | 9/1991 | Kamakura | ............ 703/14 |
| 5,798,938 A | * | 8/1998 | Heikes et al. | ............ 716/6 |
| 5,815,687 A | * | 9/1998 | Masleid et al. | ............ 703/14 |
| 5,825,673 A | * | 10/1998 | Watanabe | ............ 703/14 |
| 5,828,579 A | * | 10/1998 | Beausang | ............ 716/2 |
| 5,946,482 A | * | 8/1999 | Barford et al. | ............ 703/14 |
| 5,949,689 A | * | 9/1999 | Olson et al. | ............ 703/14 |
| 5,999,714 A | * | 12/1999 | Conn et al. | ............ 716/2 |
| 6,040,716 A | * | 3/2000 | Bosshart | ............ 326/98 |
| 6,344,759 B1 | * | 2/2002 | Srivastava et al. | ............ 326/98 |
| 6,363,515 B1 | * | 3/2002 | Rajgopal et al. | ............ 716/5 |

OTHER PUBLICATIONS

C.H.Chang, S.C. Chang, J.S. Wang, W.B. Jone, "Charge Sharing Fault Detection for CMOS Domino Logic Circuits", IEEE, Nov. 1999, pp. 77–85.*

Arai Sinha, Sandeep K. Gupta and Melvin A. Breuer, "Validation and Test Generation for Oscillatory Noise in VLSI Interconnects", Nov. 1999, IEEE, pp. 289–296.*

* cited by examiner

Primary Examiner—Jean R. Homere
Assistant Examiner—Dwin M. Craig
(74) Attorney, Agent, or Firm—Blakely, Sokoloff, Taylor & Zafman LLP (57) ABSTRACT

In one embodiment, the invention is a method. The method includes extracting parameters of a set of domino logic circuits. The method also includes simulating each domino logic circuit of the set of domino logic circuits. Also, the method includes reporting results of the simulation.

19 Claims, 9 Drawing Sheets

METHOD AND APPARATUS FOR FULLY AUTOMATED SIGNAL INTEGRITY ANALYSIS FOR DOMINO CIRCUITRY

BACKGROUND OF THE INVENTION

1. Field of the Invention

This invention generally relates to design and simulation of integrated circuits and more specifically relates to simulation of domino logic circuits for use in integrated circuits.

2. Description of the Related Art

Domino circuitry is a well recognized branch of digital logic circuitry. However, due to its dynamic nature, it is inherently susceptible to noise in a way that static circuitry, the other well recognized branch of digital logic circuitry, is less susceptible. Domino circuitry tends to propagate noise, rather than damping out noise as static circuitry tends to. As a result, simulating domino circuitry to determine whether it is susceptible to noise either generated within the circuit or received from prior stages or surrounding circuitry is of great importance.

Integrated circuits utilizing domino circuitry are becoming more and more complex. Transistor minimum geometries are shrinking, the dies upon which these transistors exist are increasing in size, and therefore the number of circuits that can be placed on an integrated circuit is increasing. As a result of these increases more highly interconnected domino circuitry is included in each complex digital integrated circuit.

Furthermore, more opportunities exist for some form of crosstalk or other noise inducing phenomenon. Crosstalk typically occurs when two conductors are located close to each other physically. These two conductors are typically not actually connected or otherwise coupled together intentionally by a designer. However, some form of coupling occurs as a result of which a change of the voltage on a first conductor such as the transition from a high-to-low or low-to-high logic state will result in some form of noisy transition or change in logic state of a second conductor. This transition or change on the second conductor, which is not caused by whatever logic is driving the second conductor, results in noise which may be propagated through any domino circuitry coupled directly to the second conductor. Once propagated through that domino circuitry it may be propagated through further stages of domino circuitry. As a result it is of great importance that domino circuitry be simulated both in terms of its susceptibility to noise but also in terms of how the physical layout of the domino circuitry and its incoming and outgoing conductors tends to lead to noise being injected into the circuitry.

Classically, each stage of a circuit has been simulated independently, therefore a designer would have to design a simulation for each stage of his or her circuit and then in some manner determine what the worst-case results of preceding stages were in order to simulate the noise characteristics of whichever stage the designer is focusing on at that time. As circuits get more and more complicated and as designers are responsible for larger and larger portions of circuitry, this approach becomes inherently unwieldy, to the point where a designer may be expected to spend significantly more time simulating the circuitry than could possibly be allowed for in today's rapid-paced and tight schedules.

SUMMARY OF THE INVENTION

In one embodiment, the invention is a method. The method includes extracting parameters of a set of domino logic circuits. The method also includes simulating each domino logic circuit of the set of domino logic circuits. Also, the method includes reporting results of the simulation.

BRIEF DESCRIPTION OF THE DRAWINGS

The present invention is illustrated by way of example and not limitation in the accompanying figures.

DETAILED DESCRIPTION

A method and apparatus for fully automated signal integrity analysis for domino circuitry is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments.

Figure 1A:
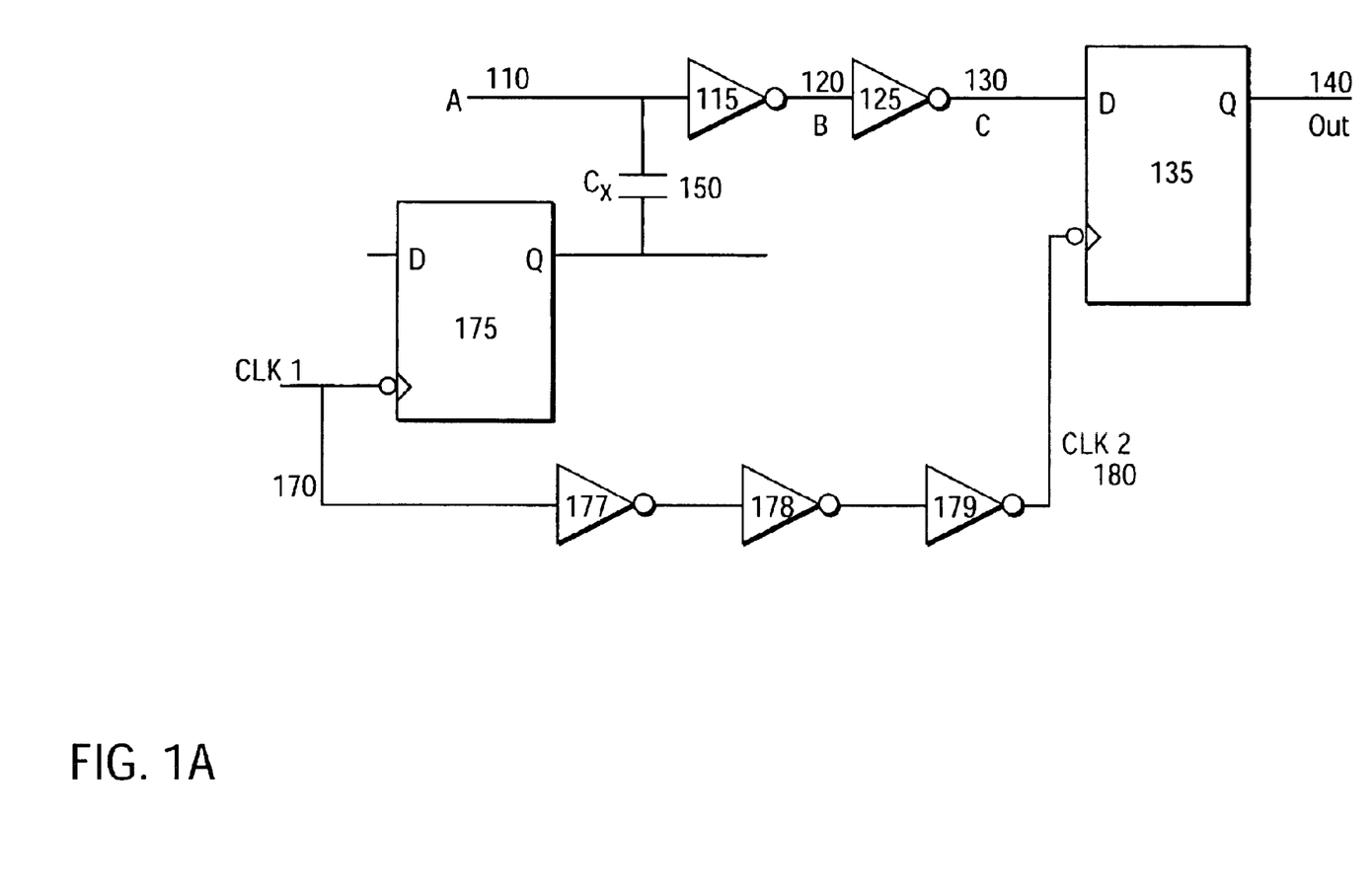
FIG. 1A illustrates an example of how incorrect data may be latched independent of clock frequency.

FIG. 1 illustrates an example of how incorrect data may be latched independent of clock frequency. A first conductor 110 is coupled to a first inverting stage 115. The first inverting stage 115 is coupled to a second conductor 120 which in turn is coupled to a second inverting stage 125. The second inverting stage 125 is coupled to a conductor 130 which in turn is coupled to the data input of a flip-flop or register 135. A fourth conductor 170 is coupled to the clock stage, the clock input of a second flip-flop or register 175. The output of flip-flop 175 is coupled to a fifth conductor 160. Conductor 160 is cross-coupled through a parasitic capacitance 150 to conductor 110. Conductor 170, aside from being coupled to flip-flop 175, is also coupled to third inverting stage 177. Third inverting stage 177 is coupled to a conductor which is coupled to fourth inverting stage 178. Fourth inverting stage 178 is coupled to a conductor which is coupled to fifth inverting stage 179. Fifth inverting stage 179 is coupled to a conductor 180 which is coupled to the clock input of flip-flop 135. The output of flip-flop 135 is coupled to conductor 140. Conductor 110 has the signal A associated with it. Conductor 110 therefore conducts the signal A. Conductor 120 conducts the signal B. Conductor 130 conducts the signal C. Conductor 160 conducts the signal D. Conductor 170 conducts the signal CLK1. Conductor 180 conducts the signal CLK2 and conductor 140 conducts the signal OUT.

Figure 1B:
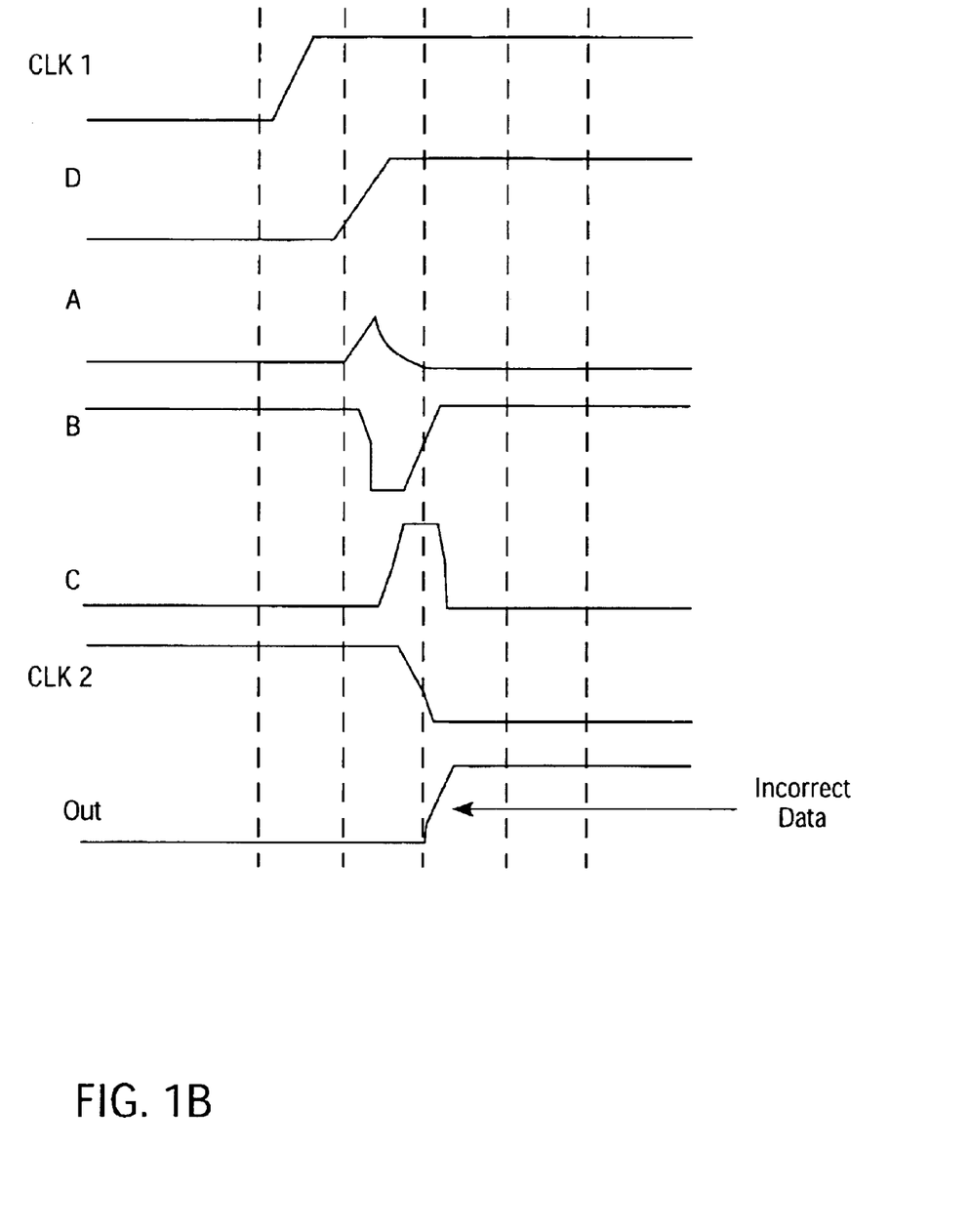
FIG. 1B illustrates waveforms corresponding to the signals on various conductors in the circuitry of FIG. 1A.

Turning to FIG. 1B the waveforms for conductors CLK1 A, B, C, D, CLK2 and OUT are all illustrated. In particular the incorrect data latched by flip-flop 135 and propagated through conductor 140 as OUT as illustrated. Note that signal A rises due to its cross coupling on conductor 110 through a capacitance 150 to conductor 160 which carries signal D. Signal D was latched at flip-flop 175 as a result of the transition on CLK1. This transition on conductor 160 or signal D results in the partial transition of signal A. This is propagated as a full transition to signal B and likewise as a full transition to signal C. CLK2 is a delayed version of CLK1 and at the time CLK2 transitions at flip-flop 135, signal C is in its erroneous state and therefore the wrong data is latched on flip-flop 135 and propagated through signal OUT.

Figure 2:
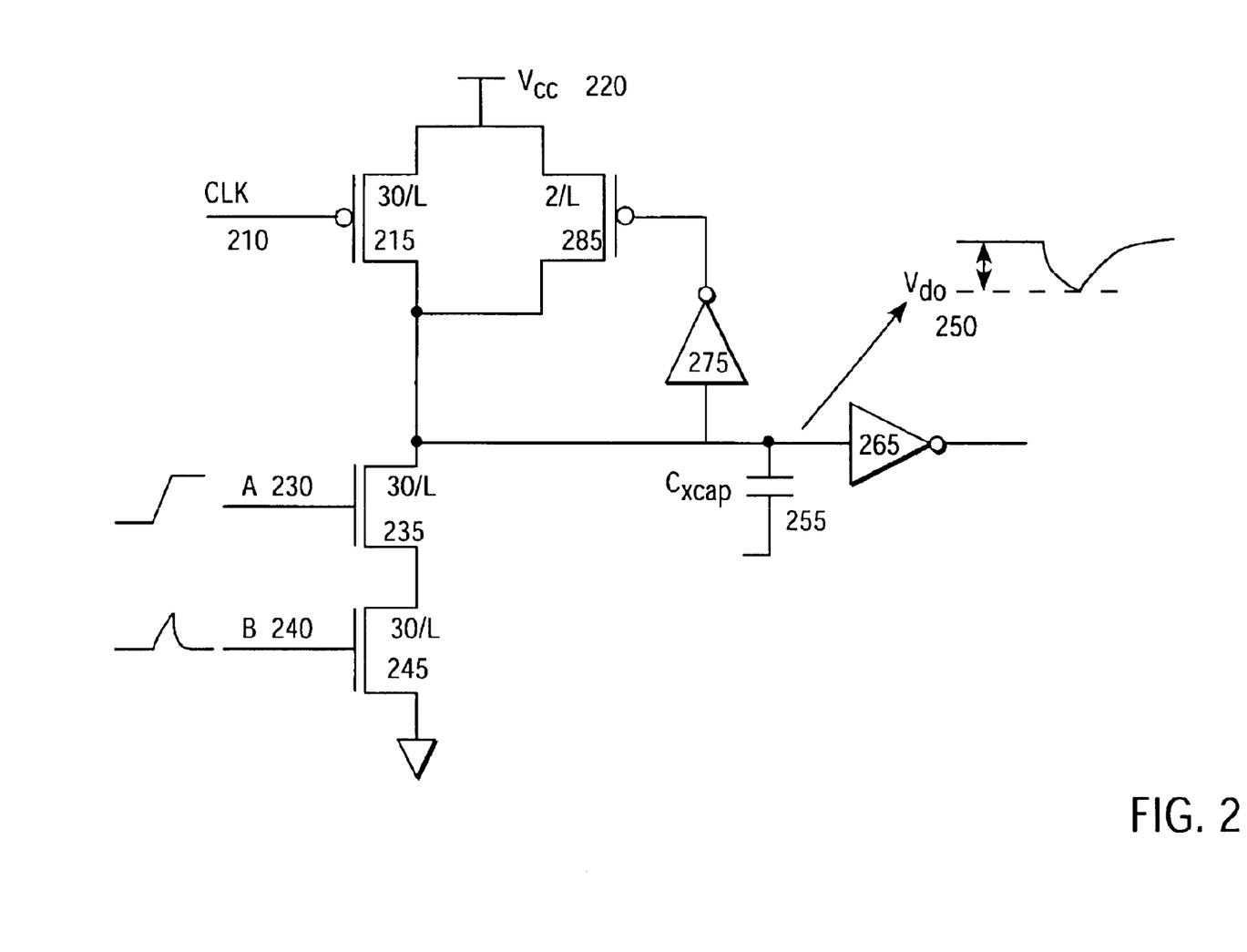
FIG. 2 illustrates an embodiment of a domino circuitry stage along with potential noisy input and output waveforms.

Turning to FIG. 2, an embodiment of the single stage domino circuit is illustrated. MOSFET 215 is controlled at its gate electrode by CLK (Clock) 210. One node of MOSFET 215 is coupled to VCC 220. The other node of MOSFET 215 is coupled to a second node of MOSFET 285. A first leg of MOSFET 285 is likewise coupled to Vcc 220. The gate electrode of MOSFET 285 is coupled to the output of inverting stage 275. The second leg of MOSFET 215 and the second leg of MOSFET 285 is coupled to the input of inverting stage 275. Input A is carried on conductor 230 which is coupled to the gate electrode of MOSFET 235. The first leg of MOSFET 285 is coupled to the second leg of MOSFET 215 and the second leg of MOSFET 285. A second leg of MOSFET 235 is coupled to a first a leg of MOSFET 245. The second leg of MOSFET 245 is coupled to ground. The gate electrode of MOSFET 245 is coupled to conductor 240 which carries the signal B. Conductor 250 carries the signal VDO and is coupled to the input of inverting buffer 275, the first leg of MOSFET 235, the second leg of MOSFET 215 and the second leg of MOSFET 285. Conductor 250 is coupled to the input of inverting output buffer 265. Furthermore conductor 250 is coupled to a parasitic capacitance 255, also labeled $C_{xcap}$, which is coupled to another conductor independent of this embodiment of the domino circuit stage. Also illustrated in FIG. 2 are waveforms for signal A and signal B illustrating previously found worst-case noise waveforms for each of these two signals. Likewise a waveform for signal VDO, which is the output of this stage, is illustrated. This waveform is the waveform determined by simulation based on waveforms for signals A and B and it illustrates the worst-case output of this stage.

Figure 3:
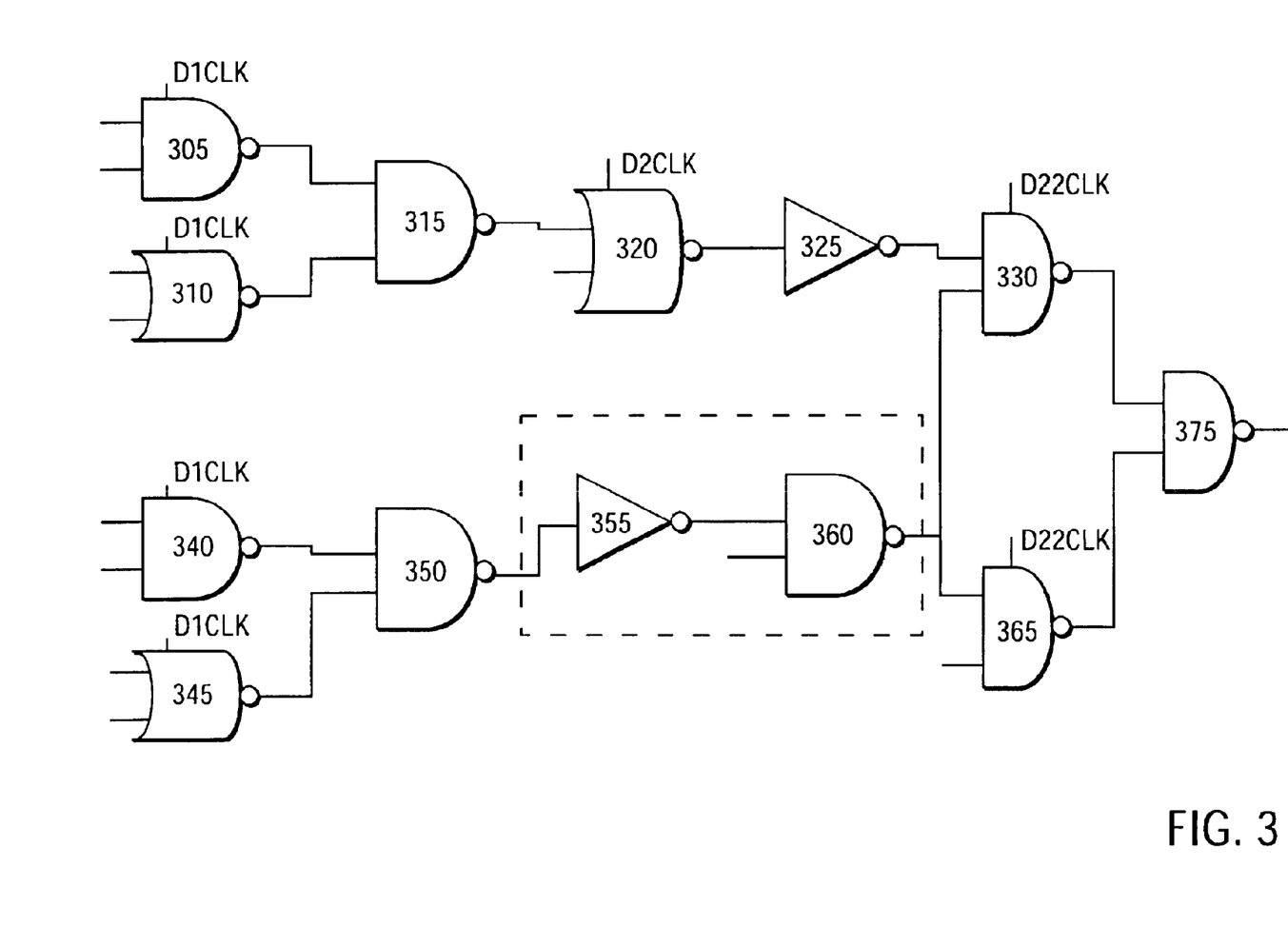
FIG. 3 illustrates an overview schematic of multiple cascaded domino stages.

Turning to FIG. 3, an overview schematic of a number of stages of domino circuitry is illustrated. Stage 305 is a domino nand gate. Stage 310 is a domino nor gate. The output of stage 305 is coupled to the first input of stage 315, a static nand gate. Likewise the output of stage 310 is coupled to the second input of stage 315. The output of stage 315 is coupled to a first input of stage 320, which is another domino nor gate. The output of stage 320 is coupled to the input of stage 325 which is a static inverting buffer. The output of stage 325 is coupled to a first input of stage 330 which is a domino nand gate.

Stage 340 is a domino nand gate. The output of stage 340 is coupled to the first input of stage 350 which is a static nand gate. Stage 345 is a domino nor gate and the output of stage 345 is coupled to a second input of stage 350. The output of stage 350 is coupled to the input of inverting buffer 355 which is a static circuit. The output of stage 355 is coupled to a first input of stage 360 which is a nand gate and is also a static circuit. The output of stage 360 is coupled to a second input of stage 330 and is also coupled to a first input of stage 365 which is a domino nand gate. The output of stage 330 is coupled to the first input of stage 375 which is a static nand gate. The output of stage 365 is coupled to second input of stage 375. Circuits 305, 310, 320 and 330 are all domino circuits and represent cascaded stages of domino circuitry (with some static circuitry intervening. Circuits 340, 345 and 365 are also domino circuits. It will be appreciated that the circuitry illustrated in FIG. 2 is one embodiment of circuitry suitable for implementing domino nor gate 320 or domino nor gate 310 for example.

When the circuitry illustrated in FIG. 3 is simulated, it is necessary that each stage have each preceding stage fully simulated before that stage may be simulated. Thus if a current stage to be simulated is stage 375 then both stage 330 and stage 365 must have already been simulated. For that to happen, as will be appreciated, each preceding stage must have been simulated. Thus simulation of this circuit must begin with simulation of one of the four initial stages 305, 310, 340 or 345. Each of those stages may be thought of as a first stage. Once those stages are simulated then a second stage, such as stage 315 or 350, may be simulated. Once those stages are simulated then third stage 320 may be simulated. Once that stage has been simulated then fourth stage 325 may be simulated. To simulate stage 330 both stage 325 and stage 360 must be simulated. Stages 350, 355 and 360 may be simulated as static circuitry.

Because stages 350, 355 and 360 (among other stages) are static circuitry they are not simulated in the same way as domino circuitry is. Rather, stage 350 is simulated with the worst-case output noise of stages 345 and 340 at a DC level rather than simulating the AC transition. That in turn results in the worst-case output noise for stage 350 which is simulated as the worst-case input noise for stage 355. Similarly, the worst-case output noise for stage 355 which is simulated as the worst-case input noise for stage 360. This results in a worst-case output noise for stage 360 which may be used as a level offset or level shift entered into stage 330 and also injected into stage 365. Stage 330 may then be simulated as may stage 365. When both stage 330 and stage 365 have been simulated then stage 375 may be the current stage and may be simulated.

Figure 4A:
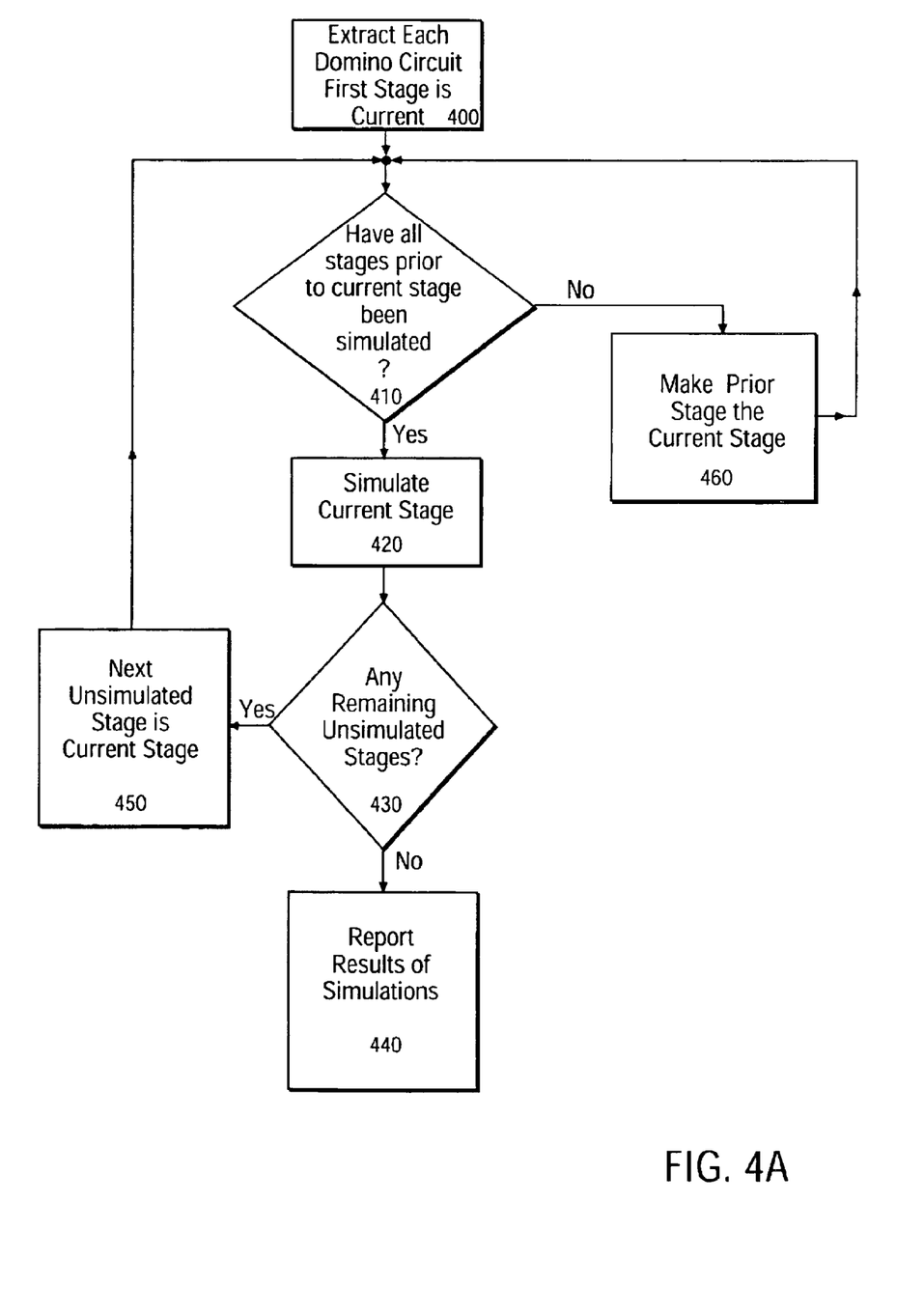
FIG. 4A illustrates one embodiment of a method of simulating domino circuitry.

Turning to FIG. 4A, an embodiment of a method of simulating domino logic such as the domino circuitry of FIG. 3 is illustrated. In block 400 the parameters of each domino circuit stage are extracted. These parameters include all of the information necessary to simulate the domino circuit stage. Also at block 400 the first stage, a stage with no prior domino circuitry feeding into it is found. That first stage is called the current stage. At block 410 a check is made to determine whether the current stage has any prior stages which need to be simulated. If all prior stages have been simulated the process flows to block 420 and the current stage is simulated resulting in information on the worst-case noise that will be generated by the current stage. The process then flows to block 430 where it is determined whether any remaining stages have not been simulated. If no stages have not been simulated (all stages simulated) then the results of all of the simulations are reported including the indication of which circuitry blocks or stages appear likely to generate an erroneous output or input. This occurs at block 440. If any stages still need to be simulated the process flows to block 450 and the next unsimulated stage is listed as the current stage. The process then flows to block 410 where it is determined whether all stages prior to the current stage have been simulated. If not all stages prior to the current stage have been simulated in block 410 the process flows to block 460 and a prior stage of the current stage is made the new current stage. The process then flows back to block 410. At this point the process will either flow to block 420 or block 460 as appropriate and follow the same process that has already been outlined.

As a result, utilizing this process on circuitry illustrated in FIG. 3, if stage 375 was the first stage to be simulated then the process would move back through the circuitry illustrated until it got to one of stages 305, 310, 340 or 345, it would then simulate up to either stage 315 or stage 350 after simulating at least two of the four initial stages. It would then simulate along the chain as far as it can get, typically up to stage 330 or 365. It would then have to back-propagate through the rest of the circuitry and simulate the other half of the circuitry illustrated in FIG. 3. Once all of the stages leading up to stage 375 were simulated then stage 375 itself could be simulated. At that point there would no remaining unsimulated stages and a report of the results of the simulation could be made.

Figure 4B:
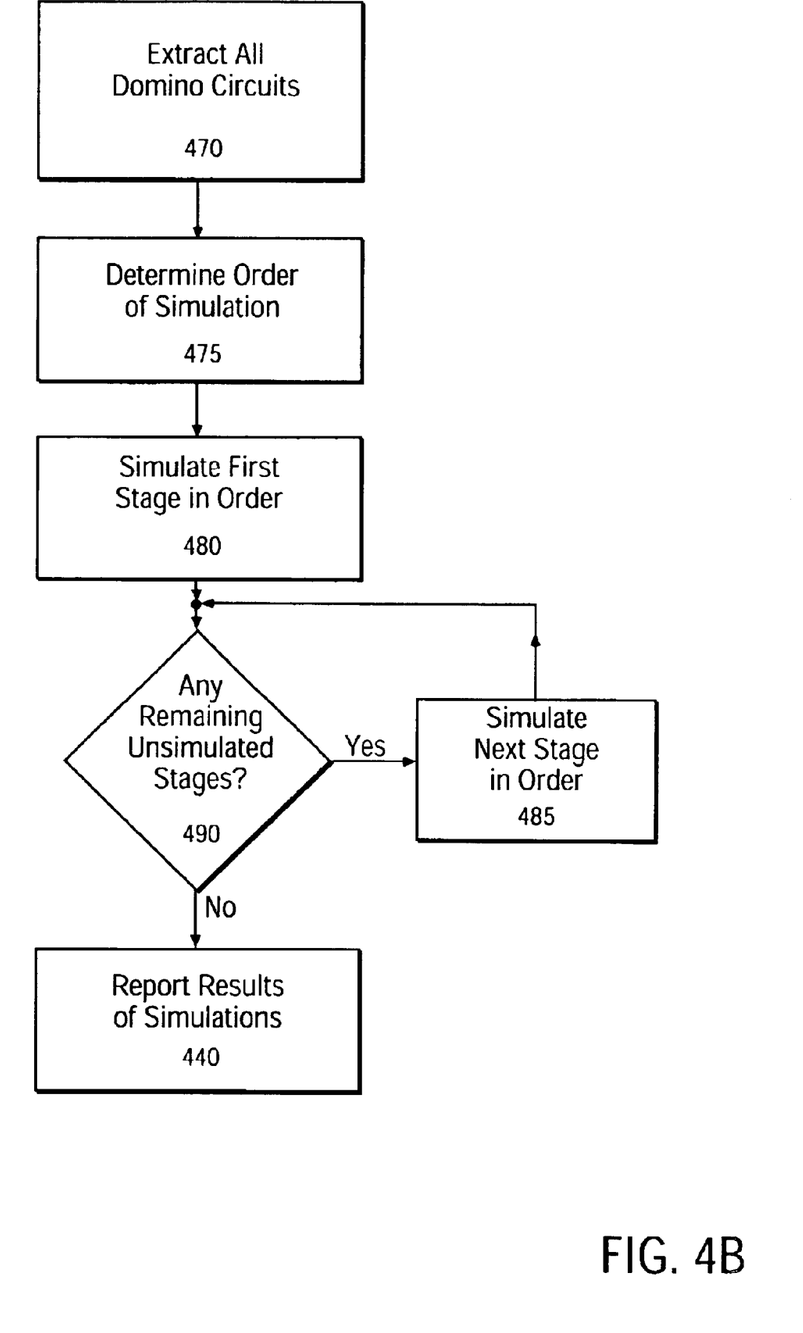
FIG. 4B illustrates an alternate embodiment of a method of simulating domino circuitry.

Turning to FIG. 4B, an alternate embodiment of a method of simulating domino circuitry is illustrated. At block 470, all information about all domino circuits is extracted (such as extracting from a netlist or similar file containing design and/or layout information). The process then flows to block 475, where the order in which the domino and other stages should be simulated is determined such that each stage will be simulated after all preceding stages are simulated, thus guaranteeing that a stage may be simulated with information about all possible injected noise (based on the simulation). Block 475 may be implemented in part because netlists and other design files include information indicating how each signal is routed, and in part because distinguishing the inputs from the outputs of a circuit in a netlist or similar file can also be accomplished.

Proceeding to block 480, the first stage in the ordered list of stages produced at block 475 is simulated. The process then flows to block 490, where a determination is made as to whether any stages remain unsimulated. If some stages remain unsimulated, the process flows to block 485, and the next stage in the ordered list of stages produced at block 475 is simulated. If all stages have been simulated, the process flows to block 440, where the report of simulation results is generated. It will be appreciated that the report of results may be generated in the same manner whether the embodiment of FIG. 4A or the embodiment of FIG. 4B is used.

Applying the embodiment of FIG. 4B to the schematic of FIG. 3, a number of options for simulation of the domino circuitry may be found. For example, each of stages 305, 310, 340 and 345 may be simulated, after which stages 315 and 350 are simulated. (It will be appreciated that stages that are simulated in groups such as 305, 310, 340 and 345 may be simulated in series or parallel.) Following that, stages 320 and 355 are simulated. Next, stages 325 and 360 are simulated. Following that, stages 330 and 365 are simulated. Finally, stage 375 is simulated.

Alternatively, stages 305 and 310 may be simulated, followed by stage 315, then stage 320, then stage 325. Next, stages 340 and 345 may be simulated, followed by stage 350, then followed by stage 355, and then followed by stage 360. Then, stages 330 and 365 may be simulated. Finally, stage 375 may be simulated.

Figure 5:
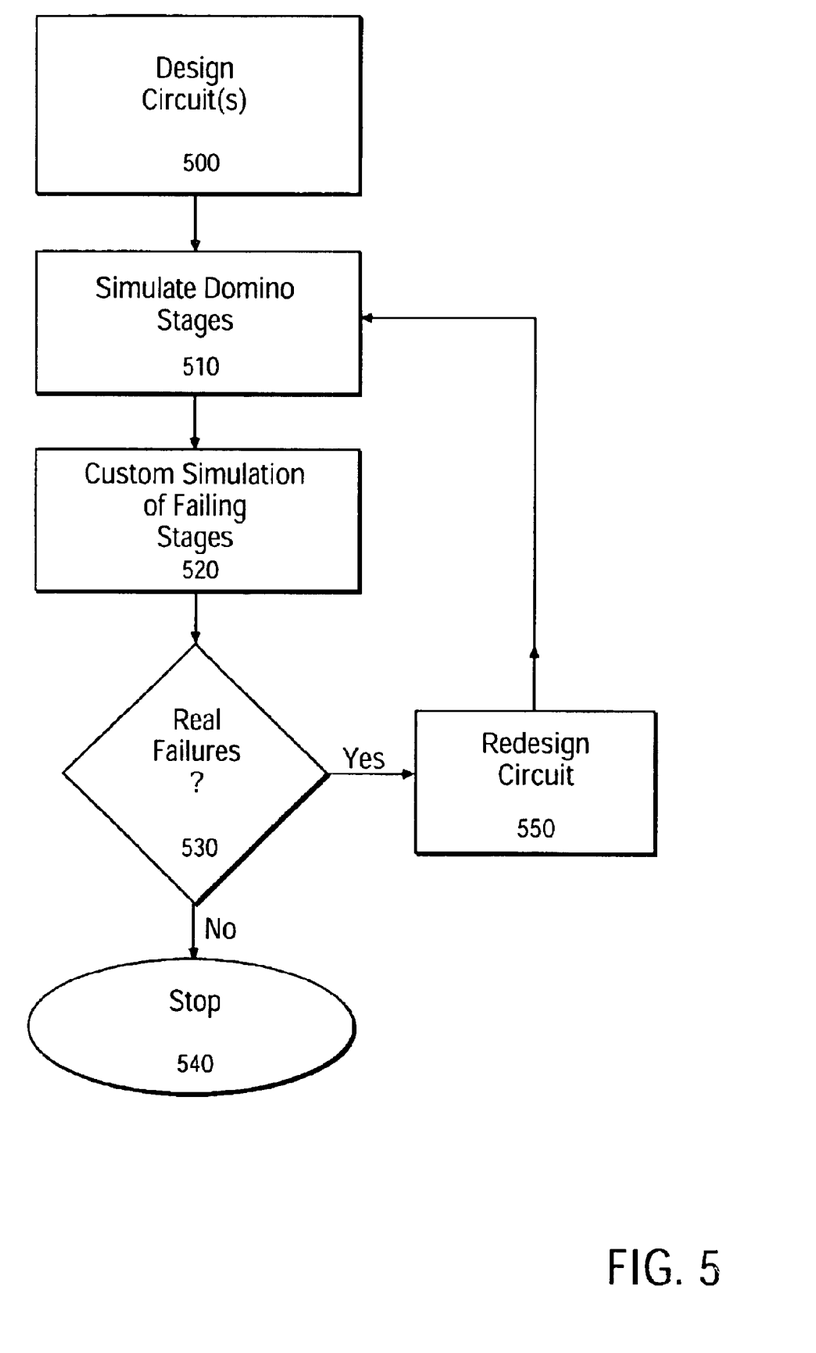
FIG. 5 illustrates one embodiment of a method of designing and simulating domino and other circuitry.

Turning to FIG. 5, an embodiment of a method of designing a circuit utilizing, among other things, an embodiment of the method of simulating domino stages is illustrated. At block 500 the circuit is initially designed including a first pass design of all domino or static logic stages. At block 510 the domino stages and the entire circuit is automatically simulated. This results in a determination of which stages appear to be failing, that is appear to be generating or propagating noise which is outside of acceptable limits. The process then proceeds to block 520 where the failing stages are simulated in a customized manner by the designer to determine whether these failures are real or are in fact some sort of artifacts or inaccuracies of simulation. This custom simulation, in one embodiment, is implemented by the designer but it will be appreciated that to some degree this custom simulation may also be automated. The process then flows to block 530 where it is determined whether there are any real failures in the circuit. If there are real failures the process flows to block 550 where the designer redesigns the circuit to eliminate or reduce the noise encountered in the failing stages. The process then flows back to block 510 and the stages are simulated again. After the stages are simulated again the process flows to block 520, and another custom simulation of any failing stages is performed. The process then flows to block 530. If no real failures are encountered then the design is believed to be complete and the process flows to completion block 540. Otherwise the process may loop around as many times as necessary until the circuit is believed to be passing the check for noise implemented in the simulation of stages.

Figure 6:
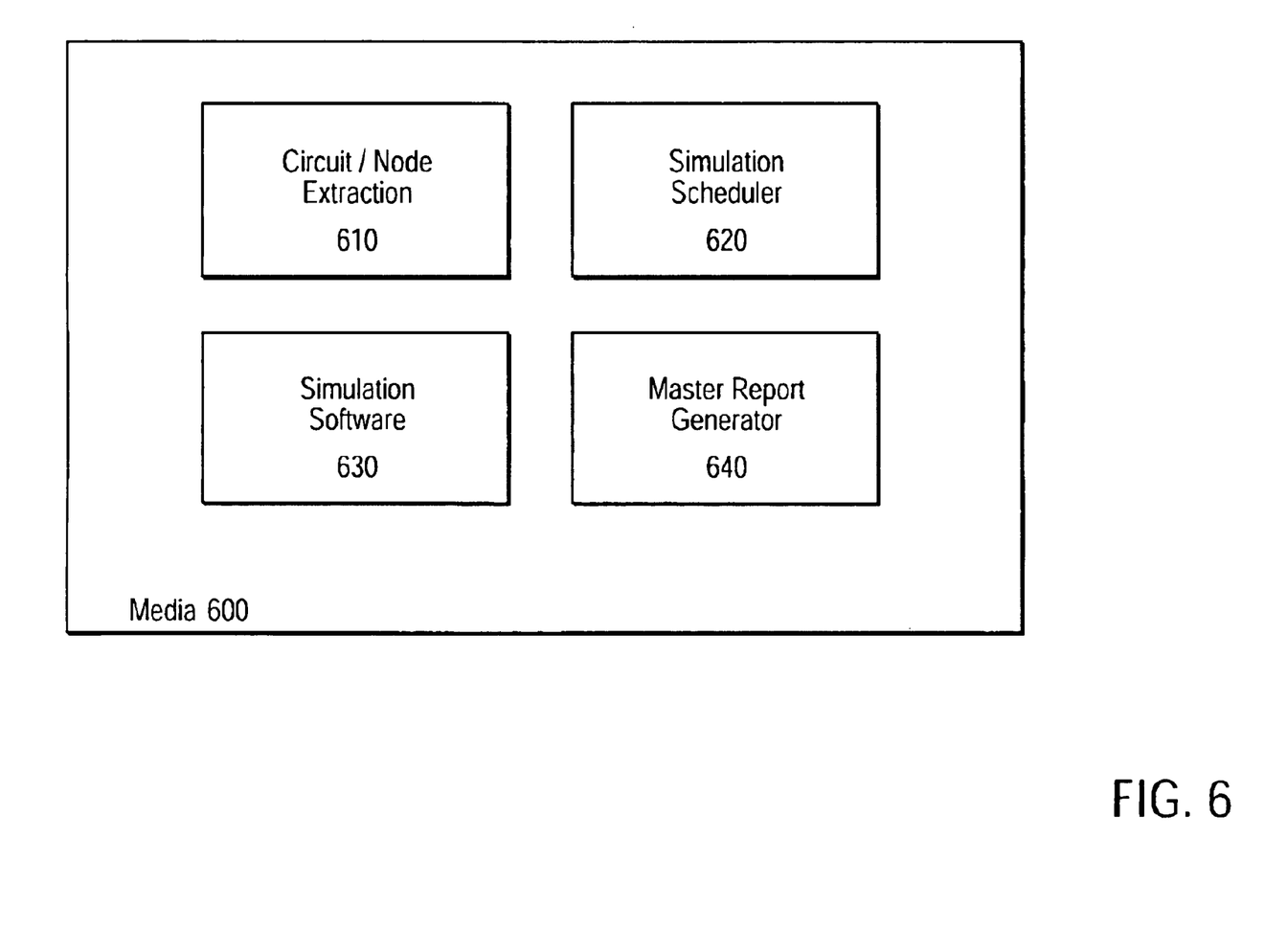
FIG. 6 illustrates a machine readable medium embodying instructions suitable for use on a processor for causing the processor to execute the method of FIG. 4.

Turning to FIG. 6, an illustration of a machine readable medium embodying instructions suitable for execution by a processor, is illustrated. Medium 600 embodies instructions for circuit or node extraction 610 which when executed by a processor causes the processor to extract the parameters for the various stages previously discussed. Medium 600 also embodies simulation scheduler 620 which schedules which stage should be simulated next by determining whether that stage depends on any stages which have not yet been simulated. Medium 600 also embodies simulation software 630 which actually simulates each stage once simulation scheduler has determined which stage should be simulated next. Medium 600 also embodies master report generator 640 which takes the results of each invocation of simulation software 630 and compiles those results into a master report suitable for viewing or analysis by the designer.

Figure 7:
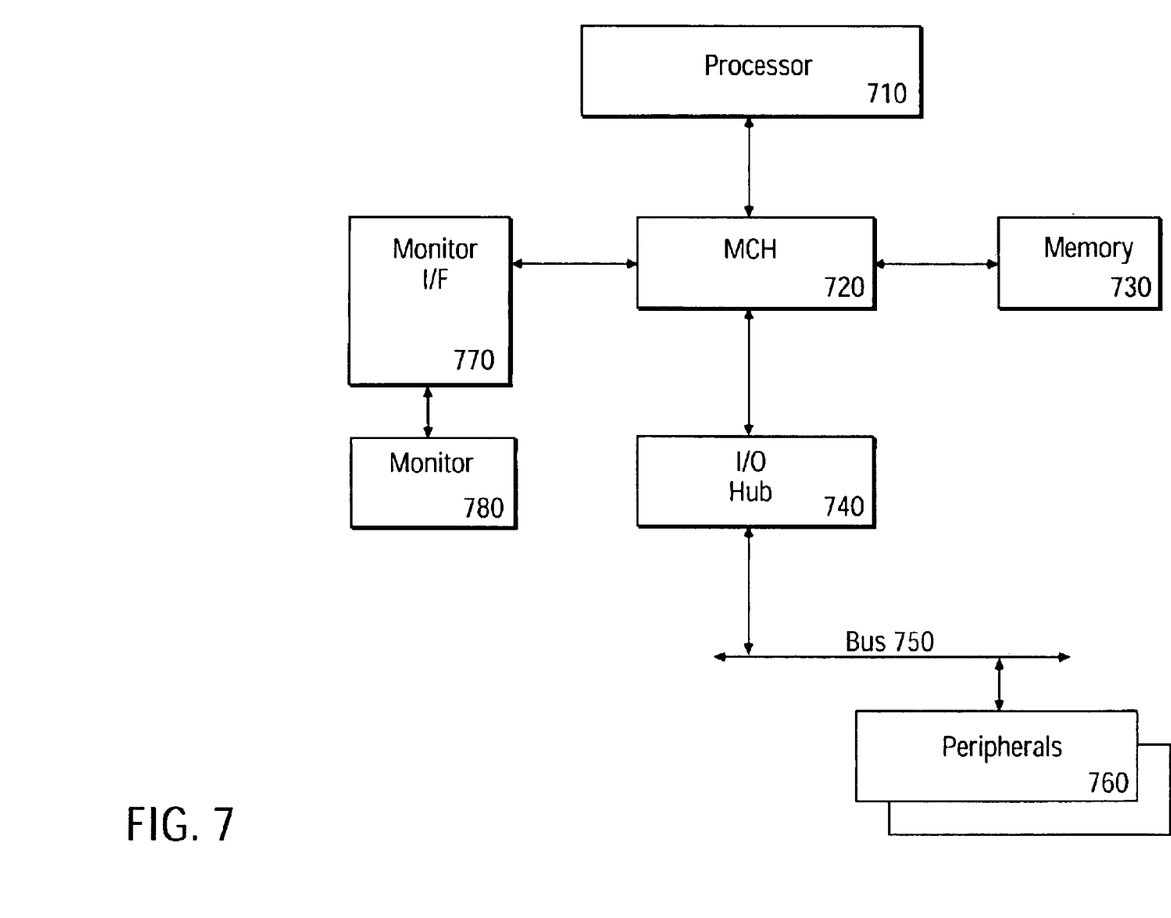
FIG. 7 illustrates a system suitable for implementing the method of FIG. 4 or alternative embodiments of a method of simulating domino circuitry.

Turning to FIG. 7, a system suitable for implementation or execution of the method discussed previously is illustrated. The system includes processor 710 which is coupled to memory control hub 720. Memory control hub 720 is coupled to memory 730. Memory control hub 720 is also coupled to monitor interface 770 and memory control hub 720 is coupled to input/output hub 740. Monitor interface 770 is coupled to monitor 780. Input/output hub 740 is coupled to bus 750. Bus 750 is coupled to one or more peripherals 760. The machine readable medium of FIG. 6 may be a medium readable by one of peripherals 760. It may also be memory 730. A machine readable medium may be some form of memory such as random access or read only memory. It may also be a magnetic medium such as a tape or disk and may further be embodied in a carrier wave or other receivable medium, and may also be embodied in an optical medium. The machine readable medium will embody instructions which may be executed by processor 710 to cause processor 710 to extract information about each node of the circuit, schedule simulation of those nodes, simulate those nodes, and generate report information about those nodes. Report information may be stored in memory 730 or by one of peripherals 760 or may be displayed on monitor 780.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A method comprising:
   extracting parameters of a set of domino logic circuits, each domino logic circuit of the set of domino logic circuits having inputs and an output;
   simulating each domino logic circuit of the set of domino logic circuits, each domino logic circuit simulated after any domino logic circuit feeding into at least one of the inputs of the domino logic circuit has been simulated; and
   reporting results of the simulating indicating whether any of the domino logic circuits is likely to generate an erroneous output.

2. The method of claim 1 wherein:
   simulating each domino logic circuit includes using the simulated results of circuits coupled to the inputs of the domino logic circuit.

3. The method of claim 2, wherein:
   simulating each domino logic circuit includes determining worst-case noise that will be generated by each domino logic circuit.

4. A method, comprising:
   scheduling a set of domino logic circuits into an ordered list, the ordered list positioning all domino logic circuits of the set of domino logic circuits feeding into an input of another domino logic circuit of the set of domino logic circuits before a position of the another domino logic circuit in the ordered list;
   simulating each domino logic circuit according to the ordered list; and
   determining whether any of the domino logic circuits is likely to generate an erroneous output.

5. The method of claim 4 further comprising:
   extracting the parameters for each domino logic circuit of the set of domino logic circuits.

6. The method of claim 5 further comprising:
   reporting results of the simulating.

7. The method of claim 6 wherein:
   the extracting further including extracting parameters of non-domino circuits;
   the scheduling further including scheduling non-domino circuits into the ordered list; and
   the simulating further including simulating non-domino circuits.

8. The method of claim 7 wherein:
   the reporting further including reporting results of the simulating non-domino circuits.

9. The method of claim 4 wherein:
   simulating each domino logic circuit includes determining worst-case noise that will be generated by each domino logic circuit.

10. A machine readable medium embodying instructions which, when executed by a processor, cause the processor to perform a method, the method comprising:
    scheduling a set of domino logic circuits into an ordered list, the ordered list positioning all domino logic circuits of the set of domino logic circuits feeding into an input of another domino logic circuit of the set of domino logic circuits before a position of the another domino logic circuit in the ordered list; and
    simulating each domino logic circuit according to the ordered list; and
    determining whether any of the domino logic circuits is likely to generate an erroneous output.

11. The machine readable medium of claim 10 further embodying instructions which, when executed by a processor, cause the processor to perform the method further comprising:
    extracting the parameters for each domino logic circuit of the set of domino logic circuits.

12. The machine readable medium of claim 11 further embodying instructions which, when executed by a processor, cause the processor to perform the method further comprising:
    reporting results of the simulating.

13. The machine readable medium of claim 12 further embodying instructions which, when executed by a processor, cause the processor to perform the method wherein:
    the extracting further including extracting parameters of non-domino circuits;
    the scheduling further including scheduling non-domino circuits into the ordered list; and
    the simulating further including simulating non-domino circuits.

14. The machine readable medium of claim 10, further embodying instructions which, when executed by a processor, cause the processor to perform the method wherein:
    simulating each domino logic circuit includes determining worst-case noise that will be generated by each domino logic circuit.

15. A system comprising:
    a processor;
    a memory controller coupled to the processor;
    a memory coupled to the memory controller;
    wherein the processor executes instructions to perform the method of:
    scheduling a set of domino logic circuits into an ordered list, the ordered list positioning all domino logic circuits of the set of domino logic circuits feeding into an input of another domino logic circuit of the set of domino logic circuits before a position of the another domino logic circuit in the ordered list;
    simulating each domino logic circuit according to the ordered list; and
    reporting results of the simulating indicating whether any of the domino logic circuits is likely to generate an erroneous output.

16. The system of claim 15 wherein the processor further executes instructions to perform the method further comprising:

extracting the parameters for each domino logic circuit of the set of domino logic circuits.

17. The system of claim 15 wherein:

simulating each domino logic circuit includes determining worst-case noise that will be generated by each domino logic circuit.

18. An apparatus comprising:

means for extracting parameters for each domino logic circuit of a set of domino logic circuits;

means for scheduling the set of domino logic circuits into an ordered list, the ordered list positioning all domino logic circuits of the set of domino logic circuits feeding into an input of another domino logic circuit of the set of domino logic circuits before a position of the another domino logic circuit in the ordered list;

means for simulating each domino logic circuit according to the ordered list means for reporting results of the means for simulating, the results indicating whether any of the domino logic circuits is likely to generate an erroneous output.

19. The system of claim 18 wherein:

means for simulating each domino logic circuit includes determining worst-case noise that will be generated by each domino logic circuit.

* * * * *